(12) United States Patent
Yun et al.

(10) Patent No.: US 7,557,044 B2
(45) Date of Patent: Jul. 7, 2009

(54) NANOMACHINED MECHANICAL COMPONENTS USING NANOPLATES, METHODS OF FABRICATING THE SAME AND METHODS OF MANUFACTURING NANOMACHINES

(75) Inventors: Yong Ju Yun, Chungcheongnam-do (KR); Chil Seong Ah, Daejeon (KR); Dong Han Ha, Daejeon (KR); Hyung Ju Park, Busan (KR); Wan Soo Yun, Daejeon (KR); Kwang Cheol Lee, Daejeon (KR); Gwang Seo Park, Seoul (KR)

(73) Assignee: Korean Research Institute of Standards and Science, Daejeon (KR)

( * ) Notice: Subject to any disclaimer, the term of this patent is extended or adjusted under 35 U.S.C. 154(b) by 437 days.

(21) Appl. No.: 11/263,476

(22) Filed: Oct. 31, 2005

(65) Prior Publication Data
US 2008/0006888 A1    Jan. 10, 2008

(30) Foreign Application Priority Data
Feb. 14, 2005   (KR)  ...................... 10-2005-0011968

(51) Int. Cl.
H01L 21/302   (2006.01)
(52) U.S. Cl. .................. 438/712; 977/883; 977/888
(58) Field of Classification Search .............. 977/883, 977/889, 725, 888, 777; 438/712
See application file for complete search history.

(56) References Cited

U.S. PATENT DOCUMENTS

| | | | | |
|---|---|---|---|---|
| 5,725,995 | A * | 3/1998 | Leedy ................ | 257/E21.526 |
| 7,306,963 | B2 * | 12/2007 | Linden ................ | 438/40 |
| 2005/0103746 | A1 * | 5/2005 | Nadeau et al. ........ | 216/62 |
| 2005/0281682 | A1 * | 12/2005 | Paxton et al. ........ | 417/53 |
| 2006/0116002 | A1 * | 6/2006 | Kalkhoran et al. .... | 977/840 |
| 2006/0153480 | A1 * | 7/2006 | Boedo et al. ......... | 384/215 |

OTHER PUBLICATIONS

Ah et al., Size-Controlled Synthesis of Machinable Single Crystalline Gold Nanoplates, Chem. Mater., 2005, vol. 17, 5558-5561.*

(Continued)

*Primary Examiner*—W. David Coleman
*Assistant Examiner*—Sun M Kim
(74) *Attorney, Agent, or Firm*—DeMont & Breyer LLC

(57) ABSTRACT

Disclosed herein is a method of fabricating nano-components using nanoplates, including the steps of: printing a grid on a substrate using photolithography and Electron Beam Lithography; spraying an aqueous solution dispersed with nanoplates onto the grid portion to position the nanoplates on the substrate; depositing a protective film of a predetermined thickness on the substrate and the nanoplates positioned on the substrate; ion-etching the nanoplates deposited with the protective film by using a Focused Ion Beam (FIB) or Electron Beam Lithography; and eliminating the protective film remaining on the substrate using a protective film remover after the ion-etching of the nanoplates, and a method of manufacturing nanomachines or nanostructures by transporting such nano-components using a nano probe and assembling with other nano-components. The present invention makes it possible to fabricate the high-quality nano-components in a more simple and easier manner at a lower cost, as compared to other conventional methods. Further, the present invention provides a method of implementing nanomachines through combination of such nano-components and biomolecules, etc.

5 Claims, 10 Drawing Sheets

OTHER PUBLICATIONS

Quirk et al., Semiconductor Manufacturing Technology, Prentice-Hall, Upper Saddle River, NJ, © 2001, pp. 396-397.*

Hua et al., "Patterning of Layer-by-Layer Self-Assembled Multiple Types of Nanoparticle Thin Films by Lithographic Technique", Nano Letters, 2002, 2 (11), 1219-1222.*

Cui et al., "Integration of Colloidal Nanocrystals into Lithographically Patterned Devices", Nano Letters, 2004, 4 (6), 1093-1098.*

Sun et al., "Triangular Nanoplates of Silver: Synthesis, Characterization, and Use as Sacrificial Templates For Generating Triangular Nanorings of Gold", Advanced Materials, 2003, 15 (9), 695-699.*

* cited by examiner

NANOMACHINED MECHANICAL COMPONENTS USING NANOPLATES, METHODS OF FABRICATING THE SAME AND METHODS OF MANUFACTURING NANOMACHINES

CROSS-REFERENCE TO RELATED APPLICATIONS

This application claims priority of Republic of Korea patent application number KR 10-2005-0011968, filed Feb. 14, 2005, which is incorporated herein by reference.

BACKGROUND OF THE INVENTION

1. Field of the Invention

The present invention relates to nano-components, a method of fabricating the same, and a method of manufacturing nanomachines or nanosystems, and more particularly to a technology for manufacturing nano-components, nanomachines, nanosystems, or the like, in which nanoplates are machined by using an ion etching method such as a focused ion beam (FIB) or an ion milling and are further transported by using a nano probe to be assembled.

2. Background of the Related Art

Currently, the need for nano-components having nanometer sizes in critical dimension, and nanomahcines (hereinafter, also used as the terms incorporating nanosystems, nano-structures, etc.) manufactured by assembling and coupling the nano-components is required in various applicable fields including diagnosis and treatment of a disease, environmental engineering and the like. A method of fabricating such nano-components, etc., includes a top-down scheme in which nano-components are fabricated by using a machining technology such as a semiconductor technology or Micro-Electro-Mechanical Systems (MEMS) technology, and a bottom-up scheme in which nano-structures are manufactured by assembling the nano-components and bio-molecules or synthetic molecules.

Since the mid 1980's, there have been developed mechanical components or micro mechanical components having a size of several µm to several mm in critical dimension by using the MEMS technology in which a semiconductor technology is applied to a mechanical engineering. However, in order to machine nano-components having a size of less than several µm by using such a conventional MEMS technology, there is needed high-priced manufacturing equipment and processes, etc., leading to an increase in the manufacturing cost, which imposes an economical burden to the nano-component manufacturers.

In the meantime, there has been proposed a method in which bio-molecules or synthetic molecules are transferred to a desired position so as to be assembled with the nano-components, to thereby manufacture a nanomachine such as a motor, etc. However, for such a conventional nanomachine manufacturing method, there has been a problem in that it is deficient in process reproducibility and difficult in mass production.

SUMMARY OF THE INVENTION

Accordingly, the present invention has been made to address and solve the above-mentioned problems occurring in the prior art, and employs a method of machine-processing nanoplates formed on a substrate into various-shaped nano-components such as a nano gear, a nano printing type, a nano wheel, a nano sawtooth, etc., through a machining technology using a focused ion beam or a pattern technology using an electronic beam, as well as a method of transporting the machine-processed nano-component by using a nano probe and combining the transported nano-component with another nano-component or a micro-organism, to thereby manufacture a nanomachine. In this regard, it is an object of the present invention to provide a method which can supply nano-components and nanomachines acquiring greater importance in a relatively ease manner, at a low cost and with an improved process reproducibility.

To accomplish the above object, according to the present invention, there is provided a method of fabricating nano-components using nanoplates, the method including the steps of: spraying an aqueous solution dispersed with nanoplates onto a substrate printed with a grid to position the nanoplates on the substrate; depositing a protective film to a predetermined thickness on the substrate on which the nanoplates are positioned; ion-etching to-be-etched portions of the nanoplates deposited with the protective film; eliminating the protective film remaining on the substrate from nano-components formed on the substrate using a protective film removal agent after the ion-etching of the nanoplates.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 11b is a cross-sectional view taken along the line A-A of FIG. 11a.

DETAILED DESCRIPTION OF THE PREFERRED EMBODIMENT

Reference will now be made in detail to the preferred embodiment of the present invention with reference to the attached drawings.

The inventive method of fabricating nano-components having various shapes is characterized in that a nanoplate coated with a protective film is machine-processed into a nano-component by ion etching, and the nano-component is transported by using a nano probe to be assembled for the purpose of manufacturing a nanomachine having a more sophisticated structure.

Figure 1:
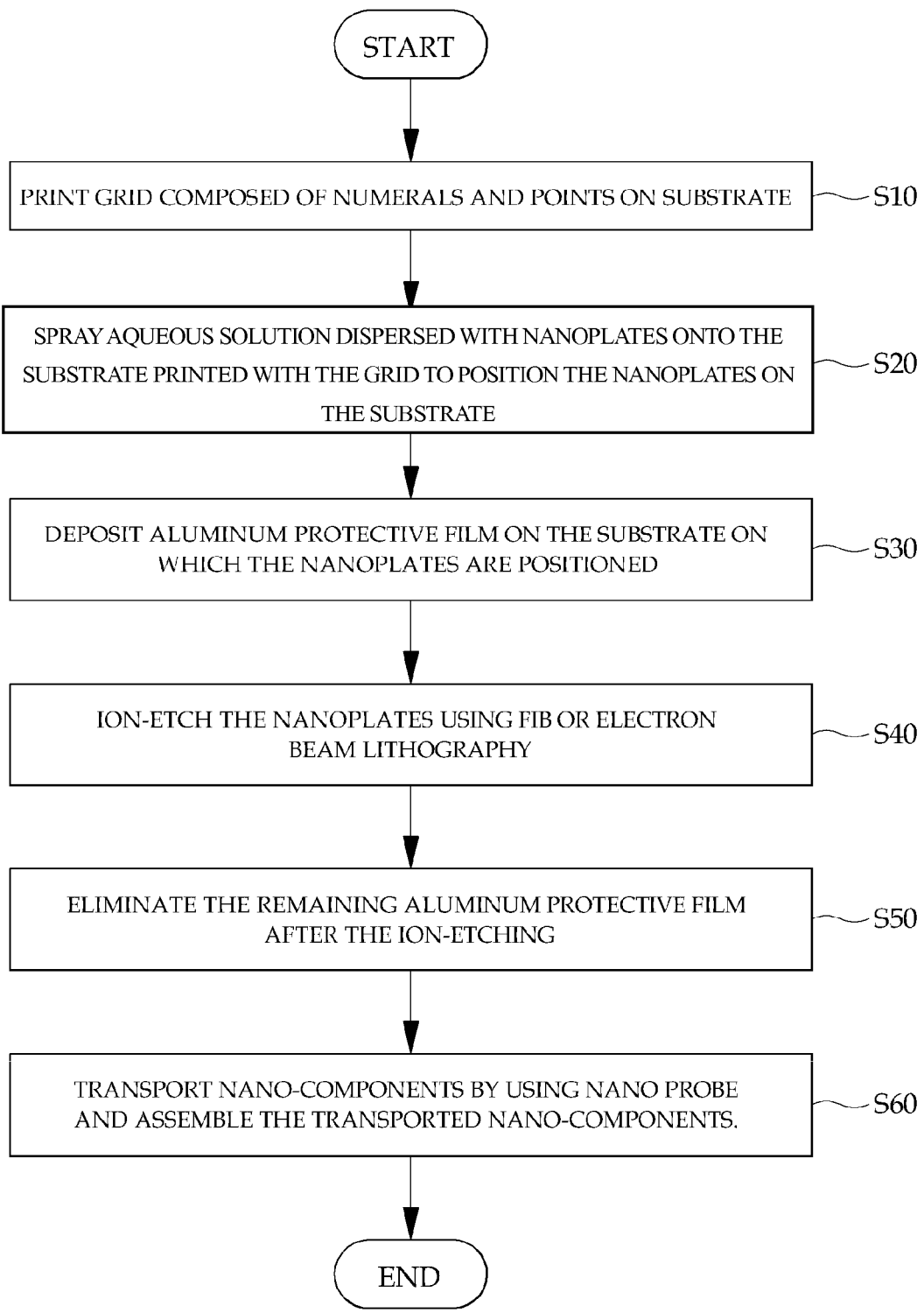
FIG. 1 is a flow chart illustrating a process of fabricating a nano-component using a nanoplate according to the preferred embodiment of the present invention.
Figure 2:
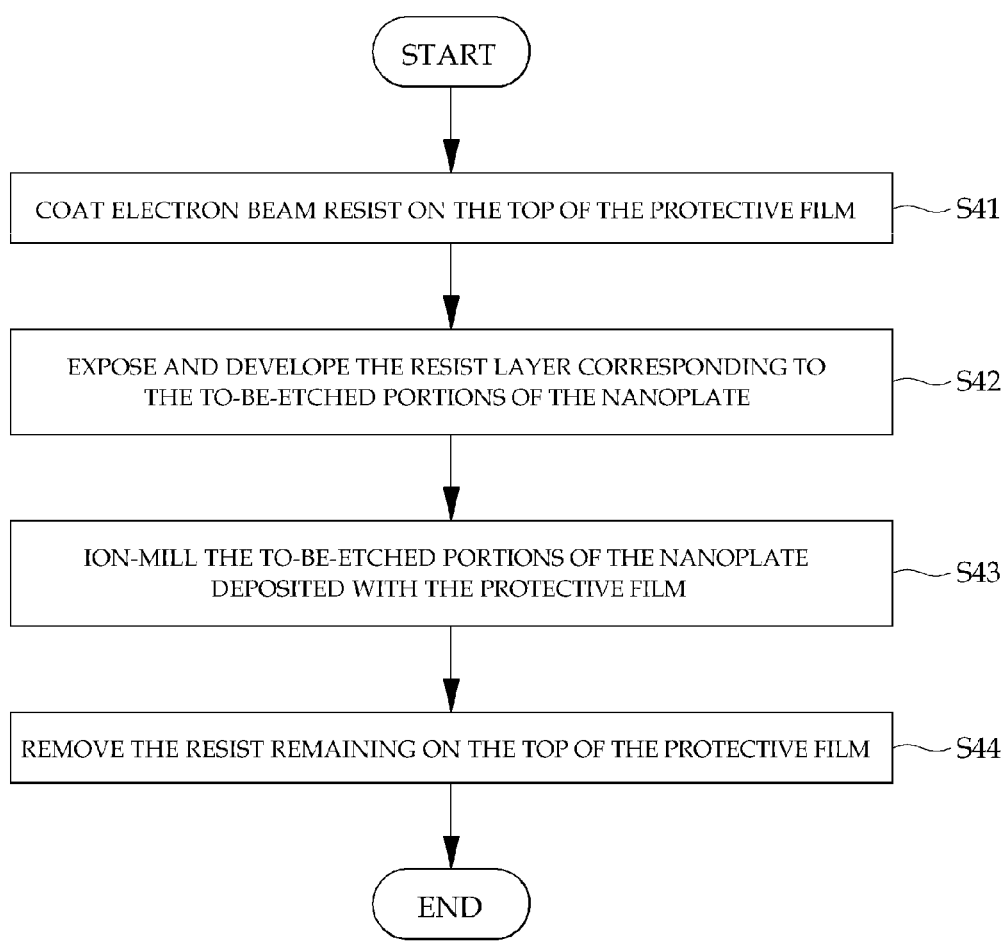
FIG. 2 is a flow chart illustrating an ion etching process in which an electron beam lithography is employed in the ion etching step (S40) of FIG. 1.
Figure 7:
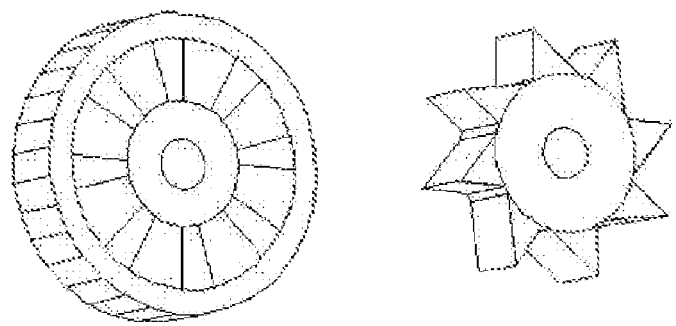
FIG. 7 is a schematic perspective view illustrating a nano wheel and a nano sawtooth according to the present invention.
Figure 8:
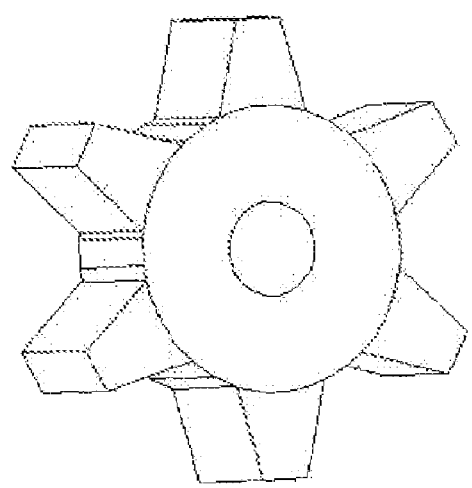
FIG. 8 is a schematic perspective view illustrating a nano gear according to the present invention.
Figure 9:
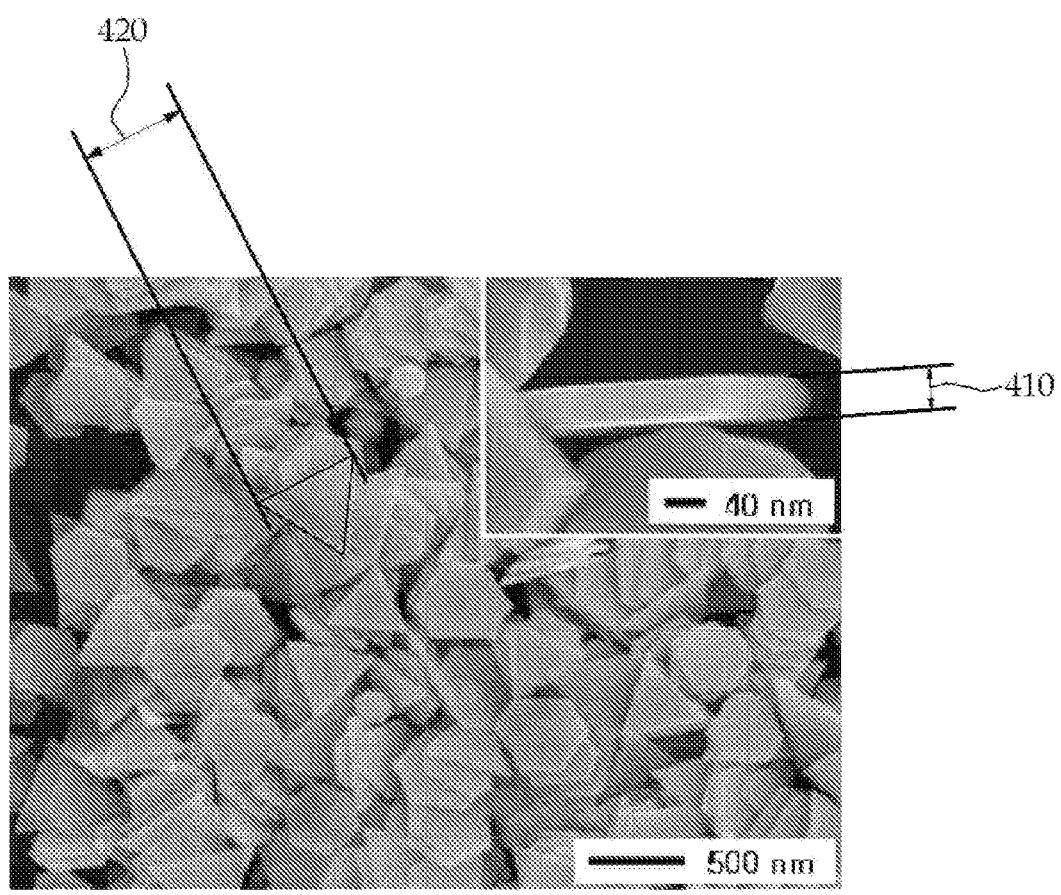
FIG. 9 is a field-emission scanning electron microscope (FE-SEM) image of a nanoplate used in the present invention.
Figure 10:
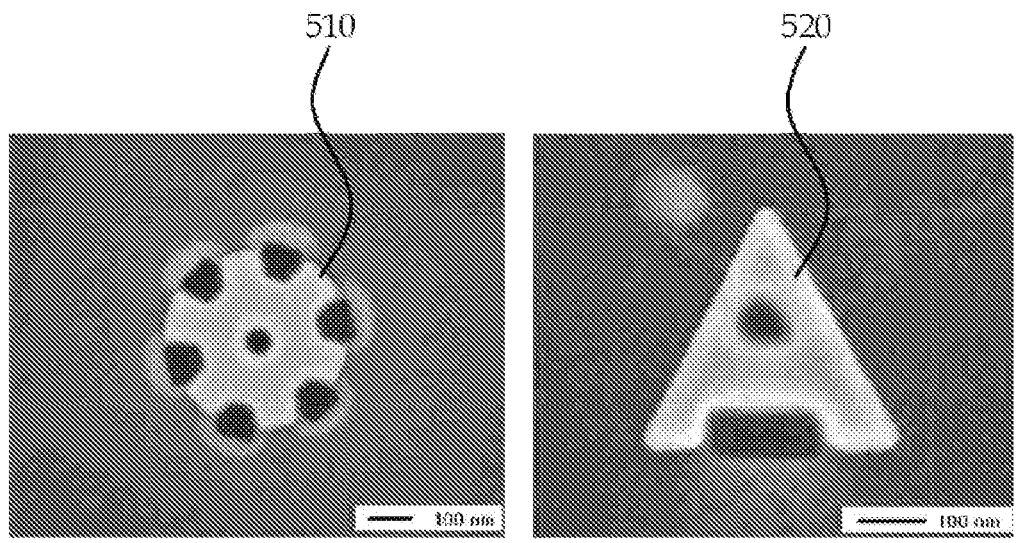
FIG. 10 is field-emission scanning electron microscope (FE-SEM) image of a nano gear and a nano printing type according to the preferred embodiment of the present invention.
Figure 11A:
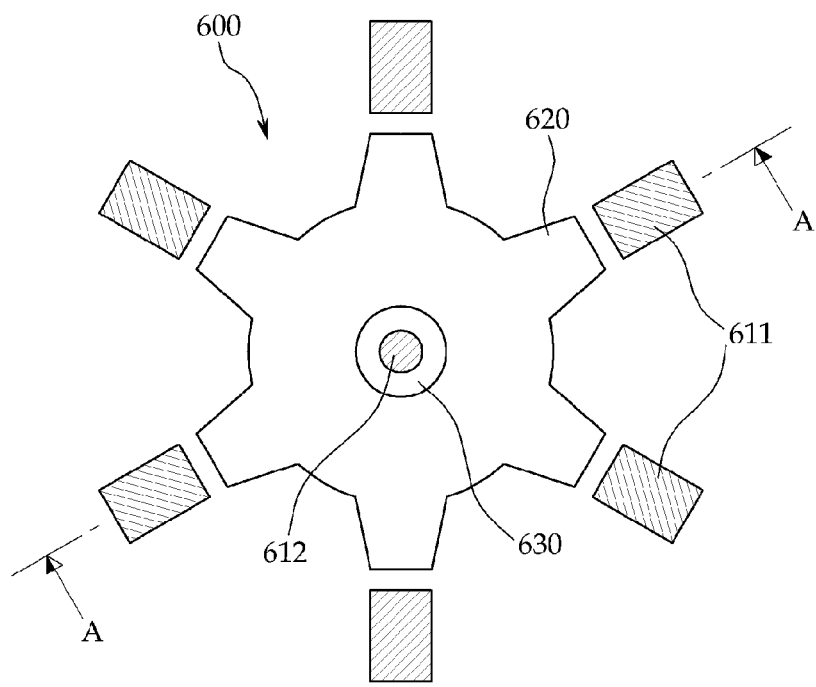
FIG. 11a is a plan view of a nano motor according to the preferred embodiment of the present invention.
Figure 11B:
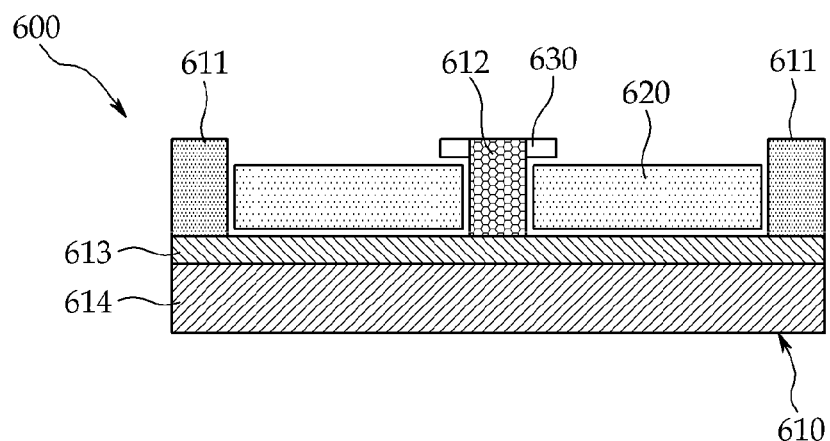

FIGS. 1 and 2 are flow charts illustrating processes of fabricating a nano-component using a nanoplate according to the preferred embodiment of the present invention, FIGS. 3a, 3b, and 4a to 4d are sub-divided process charts employing two methods in the ion etching step (S40) of FIG. 1, FIGS. 5 to 8 are schematic perspective views illustrating various-shaped nanoplates and nano-components according to the present invention, FIGS. 9 and 10 are field-emission scanning electron microscope (FE-SEM) photographs of a nanoplate and nano-components according to the present invention, and FIGS. 11a and 11b are a plan view and cross-sectional view of a nano motor manufactured by assembling nano-components.

As shown in FIG. 1, a method of fabricating a nano-component according to a preferred embodiment of the present invention includes: a step (S10) of printing a grid composed of numerals and points on a substrate; a step (S20) of spraying an aqueous solution dispersed with nanoplates on the grid portion to position the nanoplates on the substrate; a step (S30) of depositing an aluminum protective film on the substrate on which the nanoplates are positioned; a step (S40) of ion-etching the nanoplates deposited with the protective film by using a Dual Beam Secondary Electron Microscope (DB SEM)/Focused Ion Beam (FIB) or Electron Beam Lithography; and a step (S50) of eliminating the aluminum protective film remaining on the substrate using an aluminum removal agent after the ion-etching of the nanoplates.

The nano-component fabricating method may additionally include a step (S60) of transporting nano-components formed on the substrate by using a nano probe and assembling the transported nano-components.

In the grid printing step (S10), a grid is printed in the form of numerals and points on a silicon or silicon dioxide substrate by using photolithography and electron beam lithography. Thereafter, in the nanoplate positioning step (S20), about 1 μl to 2 μl of an aqueous solution dispersed with nanoplates is sprayed onto the grid portion on the substrate using a micro pipet with a volume of 1 μl to 20 μl. Here, the nanoplates may be composed of all the materials including metal, semiconductor, insulator, etc., which take a plate shape.

The protective film depositing step (S30) is a step of depositing aluminum on the top of the substrate on which the nanoplates are positioned, and also a process carried out prior to machining the nanoplates on the substrate for the purpose of preventing the nanoplates from being damaged or polluted by carbon during the ion beam focusing or observation by a field emission scanning electronic microscope. At this time, the aluminum protective film preferably has a deposition thickness of 20 nm to 60 nm. The material of the protective film is not limited to aluminum, and any material can be used sufficiently for the protective film if it does not cause a damage to nano-components and can be removed stably after etching.

The ion-etching step (S40) will be described later with reference to FIG. 2.

The aluminum protective film eliminating step (S50) is a step of eliminating the aluminum protective film remaining on the substrate using an aluminum removal agent after the completion of the ion-etching of the nanoplates. In this case, it is preferable that the aluminum removal agent (AL-12, Cyantek Corporation Inc. CA) is used for 30 seconds at a temperature of 50° C., and the substrate is washed with distilled water after the removal of the aluminum protective film.

The nano-components transporting and assembling step (S60) is a step of transporting and assembling the nano-components formed on the substrate using a nano probe (micromanipulator MM3M, Kleindiek nanotechnik, Germany) for the purpose of separating nano-components from the substrate, transporting the separated nano-components to a desired position and assembling them with another nano-component. The nano probe is mounted at the inside of focused ion beam equipment or a field emission scanning electron microscope to manipulate the nano-components. Most preferably, the nano probe has a diameter of 100 nm to 500 nm.

As shown in FIG. 2, the nanoplate ion-etching step (S40) using the Electron Beam Lithography in FIG. 1 includes a resist coating step (S41) of coating an electron beam resist on the top of the protective film to a predetermined thickness; a step (S42) of exposing and developing the resist layer of the to-be-etched portions 200 of the nanoplate with electron beam; a milling step (S43) of etching the protective film and the nanoplate corresponding to the exposed and developed portions of the resist layer; and a resist removing step (S44) of removing the resist remaining on the top of the protective film using a resist remover.

Figure 3A:
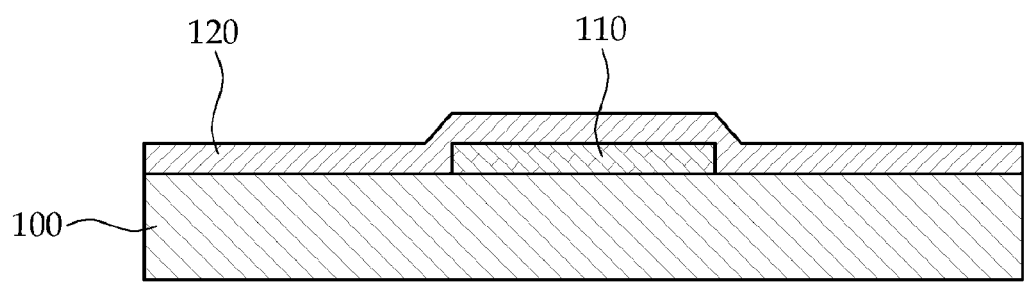
FIGS. 3a and 3b are process charts illustrating an ion etching process in which a focused ion beam (FIB) is employed in the ion etching step (S40) of FIG. 1.
Figure 3B:
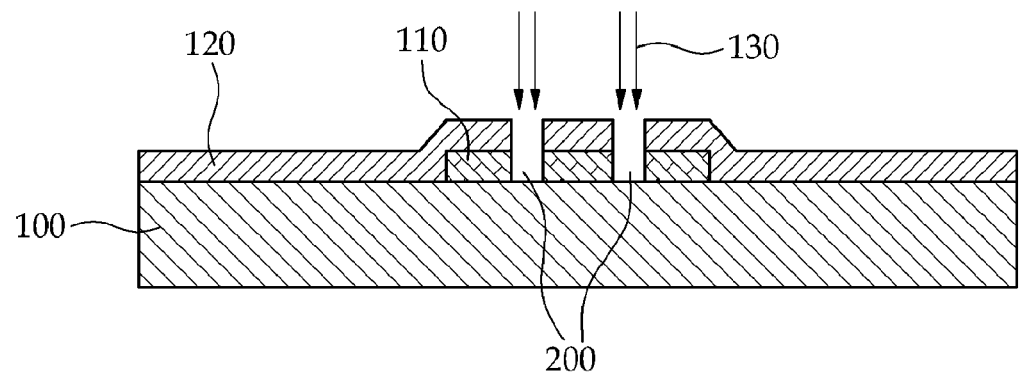

FIGS. 3a and 3b illustrate process charts of an ion etching process (S40) employing a focused ion beam (FIB) of FIG. 1. In this case, FIG. 3a shows a state before a sample is placed inside the focused ion beam equipment, in which case a nano plate 110 is positioned on the substrate 100 and a protective film 120 is formed on the whole top area of the nano plate and the substrate. FIG. 3b shows a state after the to-be-etched portions 200 of nanoplate 110 and the protective film 120 have been ion-etched by focused ion beams 130. In this case, the to-be-etched portions refer to portions to be etched on the nanoplate according to the shape of a nano-component which it is desired to manufacture. The current of the ion beams generated during the ion-etching is most preferably 1 pA to 10 pA.

Figure 4A:
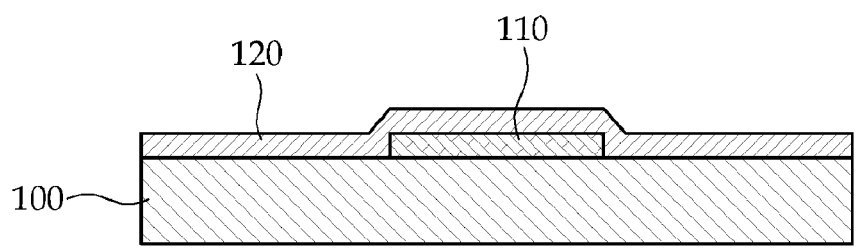
FIGS. 4a to 4d are process charts illustrating an ion etching process in which an electron beam lithography is employed in the ion etching step (S40) of FIG. 1.
Figure 4B:
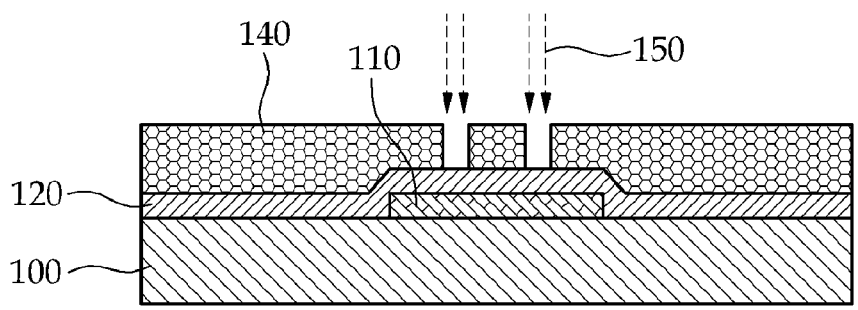
Figure 4C:
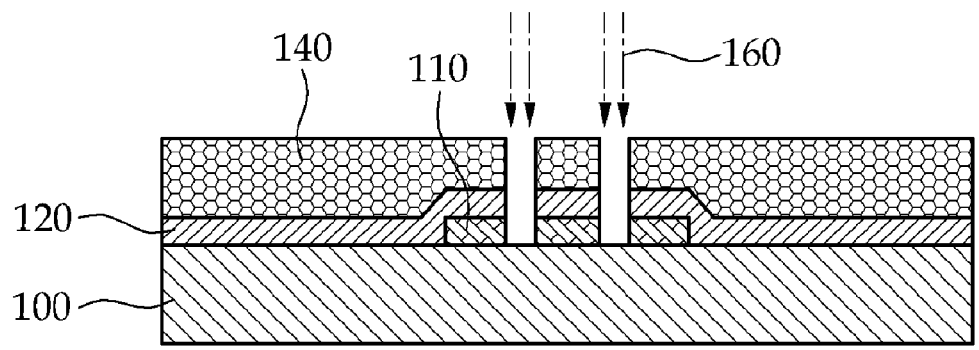
Figure 4D:
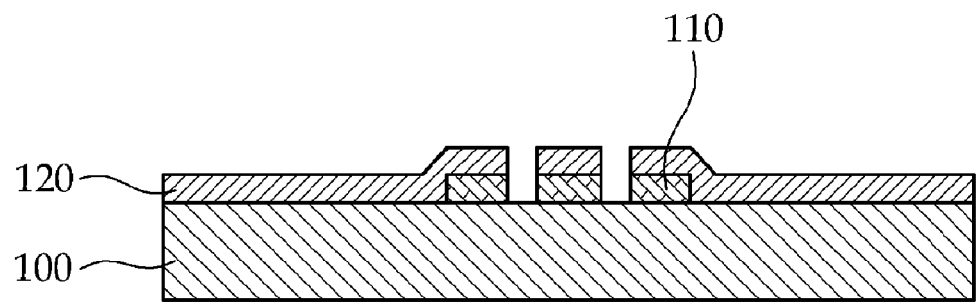

FIGS. 4a to 4d illustrate process charts of an ion etching process (S40) employing an electron beam lithography of FIG. 1. In this process, a resist is patterned in the form of nano-components such as a nano gear, nano printing type, etc., and then the to-be-etched portions of the nanoplate are etched by using ion-milling. FIG. 4a shows a state in which a sample has been prepared prior to ion-etching process, and FIG. 4b shows a state in which an electron beam resist (ZEP-520A) 140 is coated on the top surface of the protective film 120 to a thickness of about 150 nm, and then the resist layer 140 corresponding to the to-be-etched portions 200 of the nanoplate 110 is patterned by being exposed and developed with electron beam. After the exposure, the sample was submerged into a developer and was developed for about 10 seconds. Further, FIG. 4c shows a state in which only the to-be-etched portions 200 of the nanoplate deposited with the protective film, corresponding to the patterned portions of the resist layer are etched by using ion-milling with respect to the sample subjected to the electron beam lithography. During the ion-milling, a substrate holder must be cooled with cooling water or liquid nitrogen. At this time, preferably, accelerating voltage is 250 V, beam current 20 mA, and etching time is two to four minutes. FIG. 4d shows a state in which unnecessary electron beam resist remaining on the protective film 120 is eliminated following the ion-milling. In this case, in order to clearly remove the remaining electron beam resist, a dedicated electron beam resist remover (ZDMAC) must be preferably used at a temperature of 60° C. The resist-removing process takes at least four hours or more.

Figure 5:
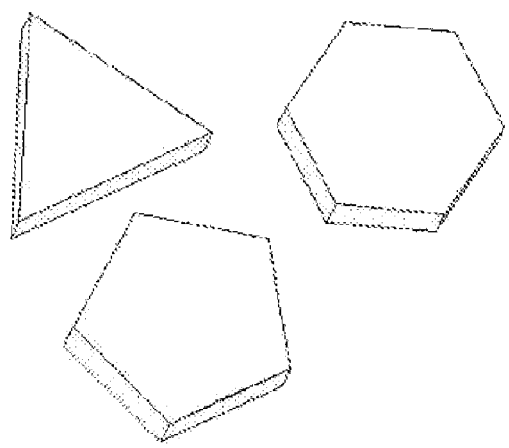
FIG. 5 is a schematic perspective view illustrating nanoplates having various shapes used in the present invention.
Figure 6:
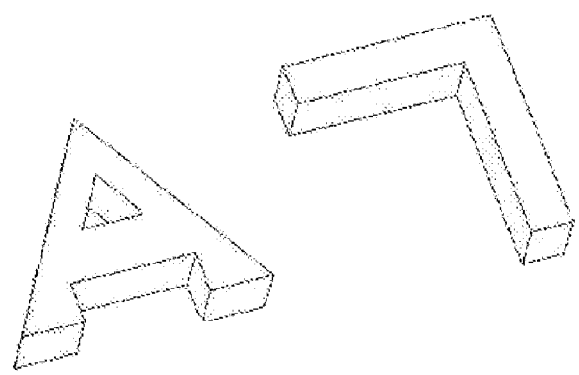
FIG. 6 is a schematic perspective view illustrating nano printing types having various shapes according to the present invention.

FIG. 5 shows various nanoplates configured in the shape of a triangle plate, a pentagonal plate and hexagonal plate. FIGS. 6, 7 and 8 respectively show examples of nano printing types, a nano wheel and a nano sawtooth, and a nano gear which are nano-components that can be manufactured by using the nanoplates of FIG. 5. The nano-components are representative ones applicable in various nanotechnological fields. The nano gear is a core component of a nanomachine. Also, the nano wheel and the nano printing types will be essentially used in a nanosystem, and the nano sawtooth in a nanofactory, etc.

Such a nano-component has a thickness of 1 nm to 500 nm, a length of 10 nm to 2,000 nm, preferably 10 nm to 1,000 nm at a planar side thereof.

It can be seen from the field-emission scanning electron microscope (FE-SEM) image shown in FIG. 9 that the nanoplate used in the present invention is formed in the shape of a plate ranging from 1 nm to 500 nm in thickness 410 and ranging from 10 nm to 2,000 nm in length 420 at a planar side thereof.

FIG. 10 shows field-emission scanning electron microscope (FE-SEM) image of a nano gear 510 and a nano printing type 520 according to the preferred embodiment of the present invention. The nano gear 510 was manufactured by using the focused ion beam (FIB), at which time, accelerating voltage is 30 kV, beam current 1 pA, and etching time is 2 minutes 30 seconds. The nano printing type 520 was manufactured by using the electron beam lithography and the ion-milling, at which time, accelerating voltage is 250 V, beam current 20 mA, and etching time is 3 minutes.

FIGS. 11a and 11b show a nano motor 600 according to a preferred embodiment of the present invention. The nano motor 600 includes a motor support 610 with a shaft 612 mounted at the center thereof, a plurality of stators 611 which are radially disposed at the circumference of the motor support 610, a rotor 620 mounted between the stators and motor support in such a fashion as to be rotated about the shaft 612, the rotor being composed of a nano gear, a shaft cover 630, etc.

In this embodiment, the motor support is manufactured by using a thicker nanoplate than the rotor composed of a nano gear. The nano probe is mounted at the inside of the focused ion beam equipment or the field-emission scanning electron microscope (FE-SEM) and is used to manipulate the nano-components. Most preferably, the nano probe has a diameter of 100 nm to 500 nm. The nano motor is manufactured by combining a micro-electro mechanical systems (MEMS) as a top-down scheme in which a shaft 612 is mounted at a certain position of the nanoplate, and a bottom-up scheme in which another nano-component is transported by using the nano probe and assembled with the nano-component.

As described above, the present invention is directed to nano-components using a single crystal nanoplate made by a simple chemical synthesis method, a method of fabricating the same, a method of manufacturing nanomachines and the like by transporting and assembling the nano-components by using a nano probe. Particularly, the nano-components according to the present invention are excellent in physical and chemical properties (strength, abrasion resistance, etc.) since the single crystal nanoplate is directly machine-processed by means of the ion-etching method. Further, the present invention makes it possible to fabricate the high-quality nano-components in a more simple and easier manner at a lower cost, as compared to other conventional methods. In addition, the present invention can provide various shaped nano-components which are smaller in size and abundant in applicability. Furthermore, since the present invention enables nano structures of type which cannot be manufactured by a chemical synthesis method to be implemented, it is possible to machine-process the nano-components to fit the characteristics of nano structures such as a change in electrical and optical properties according to a variation in material and shape of the nano structures, and other various purposes.

Moreover, the present invention can provide nano diversity which allows for application by alone or combination thereof in various nanotechnological fields, and if a bottom-up scheme and a top-down scheme in which a nano-component is fabricated and then transported to be assembled with another nano-component are combined with each other, nanosystems can be realized. Therefore, it is expected that the MEMS technology and the NEMS technology will approach toward a new technological progress direction. Specifically, since nano-components made of gold is easily coupled with bio-substance and bio-friendly, dissimilarly to silicon or other materials, they can be used for development of a new conceptual nanomachine through combination with biomolecules which attract great attentions as representative ones of functional nano substances from both academic side and industrial sectors.

Accordingly, it is expected that the nano-components manufactured by the present invention will greatly contribute to the development of nanotechnologies, particularly a nano-machine field, and can be usefully used in various industrial fields like drug delivery substance etc. requiring nano structures of specific shapes While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method of fabricating nano-components using nanoplates, comprising the steps of:
   spraying an aqueous solution dispersed with nanoplates onto a substrate printed with a grid to position the nanoplates on the substrate (S20);
   depositing a protective film to a predetermined thickness on the substrate on which the nanoplates are positioned (S30);
   ion-etching to-be-etched portions of the nanoplates deposited with the protective film (S40); and
   eliminating the protective film remaining on the substrate from a nano-component formed on the substrate using a protective film removal agent after the ion-etching of the nanoplates (S50);
   wherein the nano-component has a thickness of 1 nm to 500 nm and a length of 10 nm to 2000 nm at a planar side thereof.

2. The method set forth in claim 1, wherein the ion-etching step (S40) is performed by using a Focused Ion Beam (FIB) or an Electron Beam Lithography.

3. The method set forth in claim 1, wherein the ion-etching step (S40) is performed by using an Electron Beam Lithography and additionally comprises the steps of:
   a resist coating step (S41) of coating an electron beam resist on the top of the protective film to a predetermined thickness;
   a step (S42) of exposing and developing the resist layer corresponding to the to-be-etched portions of the nanoplate with electron beam;

a ion-milling step (S43) of etching the to-be-etched portions of the nanoplate deposited with the protective film, corresponding to the exposed and developed portions of the resist layer; and a resist removing step (S44) of removing the resist remaining on the top of the protective film using a resist remover.

4. The method set forth in claim 1, wherein the nanoplates is made of gold.

5. The method set forth in claim 1, wherein the protective film is made of aluminum and has a thickness of 20 nm to 60 nm.

* * * * *